US007719395B2

(12) United States Patent
Aoki et al.

(10) Patent No.: US 7,719,395 B2
(45) Date of Patent: May 18, 2010

(54) MAGNETIZER AND MAGNETIZING METHOD

(75) Inventors: Tetsuya Aoki, Chita-gun (JP); Takashi Kawashima, Nagoya (JP)

(73) Assignee: Denso Corporation, Kariya (JP)

( * ) Notice: Subject to any disclaimer, the term of this patent is extended or adjusted under 35 U.S.C. 154(b) by 258 days.

(21) Appl. No.: 11/874,480

(22) Filed: Oct. 18, 2007

(65) Prior Publication Data

US 2008/0094157 A1 Apr. 24, 2008

(30) Foreign Application Priority Data

Oct. 23, 2006 (JP) ............................. 2006-287238

(51) Int. Cl.

*H01F 7/20* (2006.01)
*H01F 13/00* (2006.01)
*H01F 27/42* (2006.01)
*H01H 47/00* (2006.01)
*H02P 9/12* (2006.01)
*G01R 33/00* (2006.01)
*G01R 33/10* (2006.01)

(52) U.S. Cl. ....................... 335/284; 361/143; 324/200; 307/101

(58) Field of Classification Search ................. 335/284; 29/607; 307/101; 324/200; 361/143
See application file for complete search history.

(56) References Cited

U.S. PATENT DOCUMENTS

| | | | | |
|---|---|---|---|---|
| 2,216,600 | A * | 10/1940 | Moore | 361/143 |
| 3,488,575 | A * | 1/1970 | Flora et al. | 324/228 |
| 4,354,218 | A * | 10/1982 | Steingroever et al. | 361/147 |
| 4,920,326 | A * | 4/1990 | Agarwala | 335/284 |
| 4,954,800 | A * | 9/1990 | Ohtsuka | 335/284 |
| 5,424,703 | A * | 6/1995 | Blume, Jr. | 335/284 |
| 5,659,280 | A * | 8/1997 | Lee et al. | 335/284 |
| 6,070,038 | A * | 5/2000 | Imamura et al. | 399/277 |
| 6,080,352 | A * | 6/2000 | Dunfield et al. | 264/427 |
| 6,087,915 | A * | 7/2000 | Leupold | 335/284 |
| 6,836,202 | B1 * | 12/2004 | Kim | 335/284 |
| 2006/0255893 | A1 * | 11/2006 | Brown | 335/284 |

FOREIGN PATENT DOCUMENTS

| | | |
|---|---|---|
| JP | 10-232141 | 9/1998 |
| JP | 10-248216 | 9/1998 |

* cited by examiner

*Primary Examiner*—Lincoln Donovan
*Assistant Examiner*—Mohamad A Musleh
(74) *Attorney, Agent, or Firm*—Nixon & Vanderhye PC

(57) ABSTRACT

A magnetizing coil generates a magnetic field to magnetize a magnet in a magnetizing area, in which a direction of the magnetic field is generally parallel to a magnetization direction of the magnet. A magnetizing yoke holds the magnet and is made of a magnetic material, which exhibits a magnetic potential that is generally equal to a magnetic potential of the magnet in the magnetic field at time of magnetizing the magnet. The magnetizing yoke and the magnet substantially fill a projected area of the magnet in the magnetizing area on each of first and second sides of the magnet that are opposite from each other in the magnetization direction of the magnet in the magnetizing area.

16 Claims, 5 Drawing Sheets

MAGNETIZER AND MAGNETIZING METHOD

CROSS REFERENCE TO RELATED APPLICATION

This application is based on and incorporates herein by reference Japanese Patent Application No. 2006-287238 filed on Oct. 23, 2006.

BACKGROUND OF THE INVENTION

1. Field of the Invention

The present invention relates to a magnetizer and a magnetizing method.

2. Description of Related Art

A magnetizing method for magnetizing a magnet using a magnetizing yoke is known (see, for example, Japanese Unexamined Patent Publication No. H10-248216 and Japanese Unexamined Patent Publication No. H10-232141). According to the magnetizing method recited in Japanese Unexamined Patent Publication No. H10-248216 and Japanese Unexamined Patent Publication No. H10-232141, a parallel magnetic field, which is parallel to a magnetization direction, is generated around an annular magnet using a magnetizing coil and a magnetizing yoke to form two magnetic poles of different polarities, which are opposed to each other in the magnetization direction of the annular magnet. However, at the time of magnetizing the magnet, a magnetic potential (magnetization) of the magnetizing yoke is higher than a magnetic potential (magnetization) of the magnet, so that the magnetic field is disturbed due to a difference between the magnetic potential of the magnetizing yoke and the magnetic potential of the magnet. Even in a case of a magnetizing method for magnetizing a magnet 530 shown in FIG. 5 where a magnetizing yoke is not used, the above-described type of disturbance in the magnetic field occurs due to a difference between a magnetic potential of air and a magnetic potential of the magnet 530. Therefore, even when the parallel magnetic field is generated by the magnetizing coil, some magnetic lines of force are not parallel to the magnetization direction at some locations, so that the magnet cannot be magnetized with a high accuracy in the magnetization direction.

SUMMARY OF THE INVENTION

The present invention addresses the above disadvantage. Thus, it is an objective of the present invention to provide a magnetizer and a magnetizing method for magnetizing a magnet in a magnetization direction with a relatively high accuracy.

To achieve the objective of the present invention, there is provided a magnetizer for magnetizing a magnet. The magnetizer includes a magnetic field generating means and a magnetizing yoke. The magnetic field generating means is for generating a magnetic field to magnetize the magnet in a magnetizing area. A direction of the magnetic field is generally parallel to a magnetization direction of the magnet in the magnetizing area. The magnetizing yoke holds the magnet and is made of a magnetic material, which exhibits a magnetic potential that is generally equal to a magnetic potential of the magnet in the magnetic field at time of magnetizing the magnet. The magnetizing yoke and the magnet substantially fill a projected area of the magnet in the magnetizing area on each of first and second sides of the magnet that are opposite from each other in the magnetization direction of the magnet in the magnetizing area.

To achieve the objective of the present invention, there is also provided another magnetizer for magnetizing a generally planar annular magnet. The magnetizer includes a magnetizing coil and a magnetizing yoke. The magnetizing coil generates a magnetic field upon energization thereof to magnetize the magnet in a magnetizing area. A direction of the magnetic field is generally parallel to a magnetization direction of the magnet in the magnetizing area. The magnetizing yoke holds the magnet and is made of a magnetic material, which exhibits a magnetic potential that is generally equal to a magnetic potential of the magnet in the magnetic field at time of magnetizing the magnet. The magnetizing yoke contacts both of an outer circumferential surface and an inner circumferential surface of the magnet.

To achieve the objective of the present invention, there is also provided a magnetizing method for creating magnetic poles in a magnet by placing the magnet in a magnetizing area, in which a direction of a magnetic field is generally parallel to a magnetization direction of the magnet. According to the method, first, the magnet is received in a magnetizing yoke made of a magnetic material, which exhibits a magnetic potential that is generally equal to a magnetic potential of the magnet in the magnetic field at time of magnetizing the magnet. Then, the magnetizing yoke is placed in the magnetizing area, so that the magnetizing yoke and the magnet substantially fill a projected area of the magnet in the magnetizing area on each of first and second sides of the magnet that are opposite from each other in the magnetization direction of the magnet in the magnetizing area. Thereafter, the magnetic field is applied to the magnet, which is received in the magnetizing yoke.

To achieve the objective of the present invention, there is also provided another magnetizing method for creating magnetic poles in a magnet by placing the magnet in a magnetizing area, in which a direction of a magnetic field is generally parallel to a magnetization direction of the magnet. According to the method, the magnet is received in a magnetizing yoke made of a magnetic material. Then, the magnetizing yoke is placed in the magnetizing area, so that the magnetizing yoke and the magnet substantially fill a projected area of the magnet in the magnetizing area on each of first and second sides of the magnet that are opposite from each other in the magnetization direction of the magnet in the magnetizing area. Thereafter, the magnetic field is applied to the magnet, which is received in the magnetizing yoke. A strength of the applied magnetic field makes a magnetic potential of the magnet and a magnetic potential of the magnetizing yoke to be generally the same.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

Various embodiments of the present invention will be described with reference to the accompanying drawings.

First Embodiment

Figure 1A:
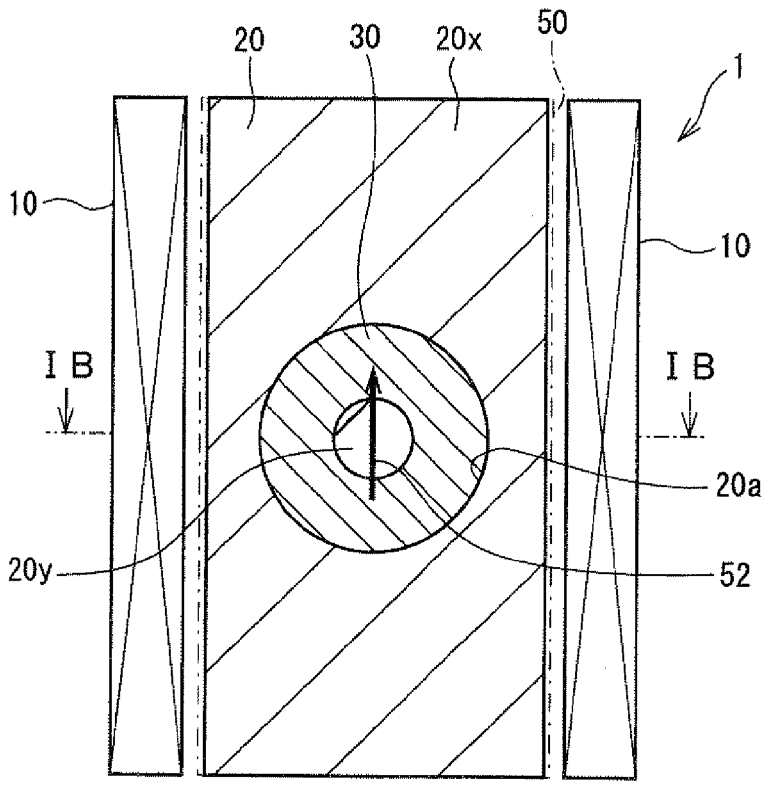
FIG. 1A is a cross sectional view of a magnetizer according to a first embodiment of the present invention.
Figure 1B:
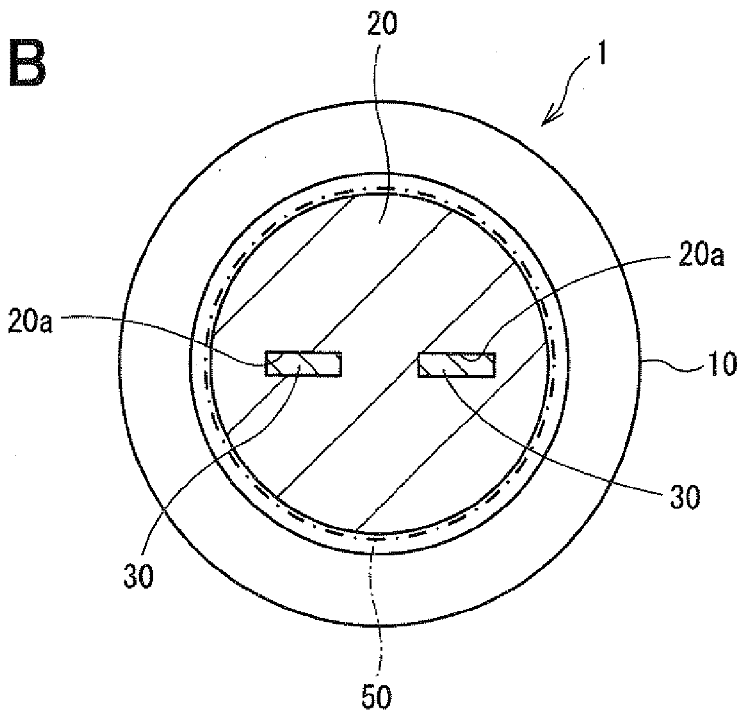
FIG. 1B is a cross sectional view taken along line IB-IB in FIG. 1A.

With reference to FIGS. 1A and 1B, a magnetizer 1 according to a first embodiment of the present invention is used to magnetize an isotropic magnet (hereinafter, referred to as a magnet) 30. The magnet 30, which serves as a magnetizing subject, is, for example, a neodymium magnet. The magnet 30, which is magnetized by the magnetizer 1, is used as, for example, a magnetic rotor that generates a rotating magnetic field in a rotational angle sensing apparatus. In the following description, the neodymium magnet 30 of a generally planar annular shape will be described as the magnetizing subject. However, it should be noted that the shape and the material of the magnet are not limited to those of this particular magnet 30 and may be modified within a scope and spirit of the present invention.

The magnetizer 1 includes a magnetizing coil (serving as a magnetic field generating means) 10 and a magnetizing yoke 20.

The magnetizing coil 10 is a hollow coil, which is wound into a cylindrical shape. The magnetizing coil 10 generates a parallel magnetic field that is generally parallel to a magnetization direction 52 of the magnet 30 in a magnetizing area 50 defined radially inward of the magnetizing coil 10. In the following description, the magnetic field, which is created by the magnetizing coil 10, will be simply referred to as a magnetic field.

The magnetizing yoke 20, which is placed in the magnetizing area 50, is made of a magnetic material, which exhibits a magnetic potential (magnetization) that is generally equal to a magnetic potential (magnetization) of the magnet 30 in the magnetic field at the time of magnetizing the magnet 30. A receiver 20*a,* which receives the magnet 30, is created in the magnetizing yoke 20. A shape of the receiver 20*a* is a transcribed shape of the shape of the magnet 30, i.e., the shape of the receiver 20*a* corresponds to the shape of the magnet 30. The magnetizing yoke 20 is formed into a cylindrical shape, which is adapted to substantially fill the magnetizing area 50 together with the magnet 30 received in the magnetizing yoke 20. Although not illustrated in the drawings for the sake of simplicity, the magnetizing yoke 20 may be separable into two halves, which may be divided along, for example, a plane that includes a top surface of the magnet 30 in FIG. 1B. In such a case, the receiver 20*a* is created in the lower half of the magnetizing yoke 20 in FIG. 1B. After, the magnet 30 is placed in the receiver 20*a* in the lower half of the magnetizing yoke 20, the upper half of the magnetizing yoke 20 may be placed over the lower half of the magnetizing yoke 20, so that the magnet 30 is entirely covered with the magnetizing yoke 20. Alternatively, the magnetizing yoke 20 may be configured to be separable in a longitudinal direction (a top to bottom direction in FIG. 1A) of the magnetizing yoke 20 at, for example, a plane that extends along the line IB-IB in FIG. 1A. Furthermore, the magnetizing yoke 20 may be configured in any other ways to receive the magnet 30 in the receiver 20*a*.

(Manufacturing Method of Magnetizing Yoke)

Next, a manufacturing method of the magnetizing yoke 20 will be described. The magnetizing yoke 20, the magnetic potential of which in the magnetizing magnetic field is generally the same as that of the magnet 30, can be manufactured by the following three manufacturing methods.

(First Manufacturing Method)

First, the magnetic material, the magnetic potential of which in the magnetizing magnetic field is generally the same as that of the magnet 30, is selected from magnetic materials, such as iron steel, soft ferrite. Then, the magnetizing yoke 20 is formed from the selected magnetic material. In this way, the magnetizing yoke 20, the magnetic potential of which in the magnetizing magnetic field is generally the same as that of the magnet 30, can be formed.

(Second Manufacturing Method)

Austenitic stainless steel, such as SUS304, is cold-worked to form the magnetizing yoke 20, the magnetic potential of which in the magnetizing magnetic field is generally the same as that of the magnet 30. Here, the magnetization characteristic of the austenitic stainless steel changes in response to a processing rate of the cold-working. Thus, by controlling the processing rate of the cold-working applied to the austenitic stainless steel, it is possible to form the magnetizing yoke 20, the magnetic potential of which in the magnetizing magnetic field is generally the same as that of the magnet 30.

(Third Manufacturing Method)

A composite material, which is a mixture of resin and magnetic powder, is injection molded to form the magnetizing yoke 20. In such a case, the magnetization characteristic of the magnetizing yoke 20 changes in response to a mixing rate of the magnetic powder relative to the resin (hereinafter, simply referred to as the mixing rate of the magnetic powder). Specifically, when the mixing rate of the magnetic powder is increased, the magnetic potential of the magnetizing yoke in the magnetizing magnetic field is increased. Thus, by controlling the mixing rate of the magnetic powder, it is possible to form the magnetizing yoke 20, the magnetic potential of which in the magnetizing magnetic field is generally the same as that of the magnet 30.

Figure 2A:
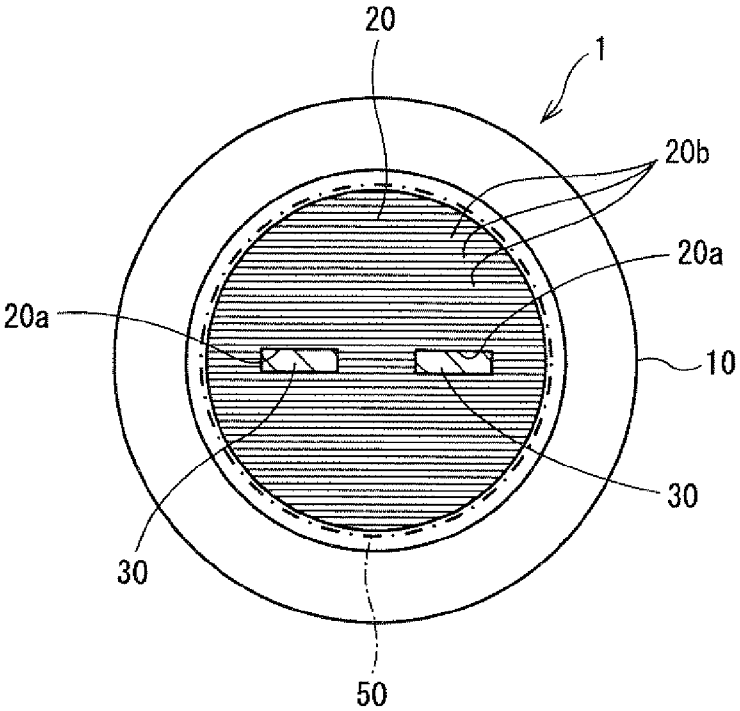
FIG. 2A is a cross sectional view similar to FIG. 1B, showing a modification of the first embodiment.
Figure 2B:
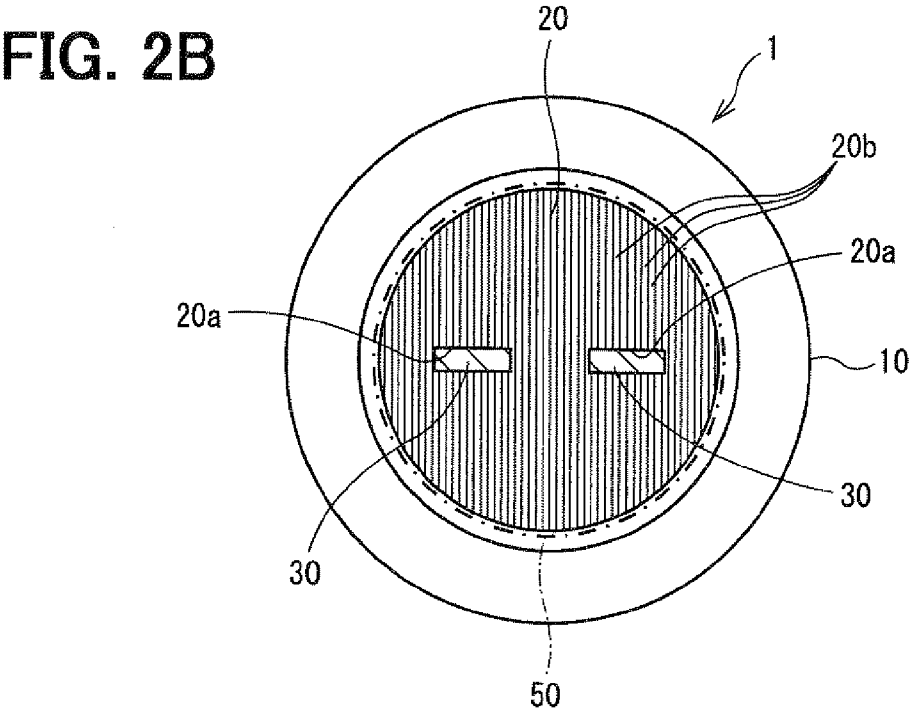
FIG. 2B is a cross sectional view similar to FIG. 2A, showing another modification of the first embodiment.

Furthermore, in a case where the magnetizing yoke 20 is formed by the above first or second manufacturing methods, the magnetizing yoke 20 may be formed by stacking and joining a plurality of plates (also sometimes referred to as sheets), each of which is made of a magnetic material, in a direction perpendicular to the magnetization direction 52. For example, with reference to FIG. 2A, which is a cross sectional view similar to FIG. 1B, a plurality of plates 20*b*, each of which is made of a magnetic material, may be stacked one after another in a direction (a top to bottom direction in FIG. 2A), which is perpendicular to the magnetization direction 52 (see FIG. 1A) and is perpendicular to the plane of the magnet 30. Alternatively, with reference to FIG. 2B, which is a cross sectional view similar to FIG. 2A, the plates 20*b* may be stacked one after another in a direction (a left to right direction in FIG. 2B), which is perpendicular to the magnetization direction 52 in the plane of the magnet 30. When the magnetizing yoke 20 is formed by the stacking of the magnetic plates to create a laminate structure of the magnetizing yoke 20, an eddy current, which is generated in the magnetizing yoke 20 by the magnetizing magnetic field, can be reduced or limited.

(Magnetizing Method of Magnet)

Next, a magnetizing method of the magnet 30 will be described.

First, the magnet 30 is received in the magnetizing yoke 20. For example, in a case where the annular magnet 30 is magnetized in the radial direction to create two magnetic poles of opposite polarities in the annular magnet 30, the magnet 30 is received in the magnetizing yoke 20 in such a manner that the plane of the magnet 30 is generally parallel to the magnetization direction 52. In this way, the magnet 30 (including both of the outer circumferential surface and the inner circumferential surface of the magnet 30) contacts closely with the magnetizing yoke 20, so that the magnet 30 is entirely covered with the magnetizing yoke 20. At this time, an outer magnetizing yoke segment 20*x* of the magnetizing yoke 20, which is placed radially outward of the magnet 30 contacts the outer circumferential surface of the magnet 30, and an inner magnetizing yoke segment 20*y* of the magnetizing yoke 20, which is placed radially inward of the magnet 30, contacts the inner circumferential surface of the magnet 30. In the present embodiment, the outer magnetizing yoke segment 20*x* and the inner magnetizing yoke segment 20*y* are integrated together to define the receiver 20*a*, which receives the magnet 30, in, for example, the above-described lower half of the magnetizing yoke 20 in FIG. 1B.

Then, the magnetizing yoke 20 is placed in the magnetizing area 50. In this way, the magnetizing area 50 is substantially filled with the magnetizing yoke 20 and the magnet 30. It should be noted that the magnetizing yoke 20 may be held stationary in the magnetizing area 50, and the magnet 30 may be received in the stationary magnetizing yoke 20, if desired.

Then, the magnetizing coil 10 is energized to generate the magnetizing magnetic field. Here, as described above, the magnetic potential of the magnetizing yoke 20 and the magnetic potential of the magnet 30 in the magnetizing magnetic field are generally the same. That is, the magnetic potential in the magnetizing area 50 is generally uniform. In this way, disturbances in the magnetic field are limited, so that magnetic lines of force, which are generally parallel to the magnetization direction 52, extend through the magnet 30. The thus created magnetizing magnetic field, which is generally parallel to the magnetization direction 52, can be effectively used to magnetize the magnet 30 in the magnetization direction 52 with a relatively high accuracy.

Second Embodiment

Figure 3A:
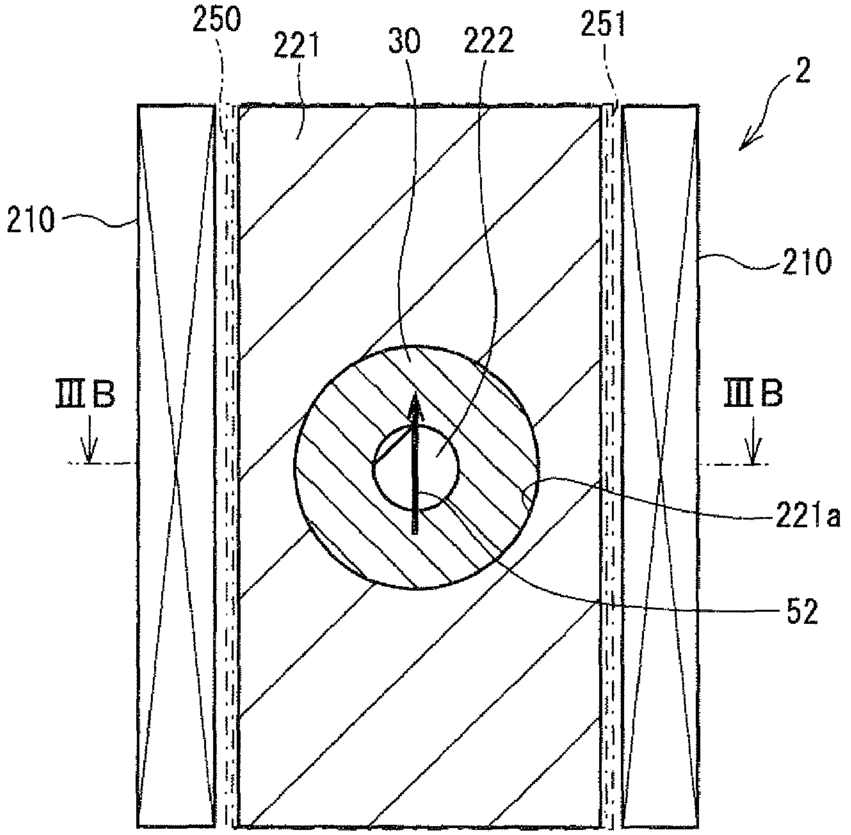
FIG. 3A is a cross sectional view of a magnetizer according to a second embodiment of the present invention.
Figure 3B:
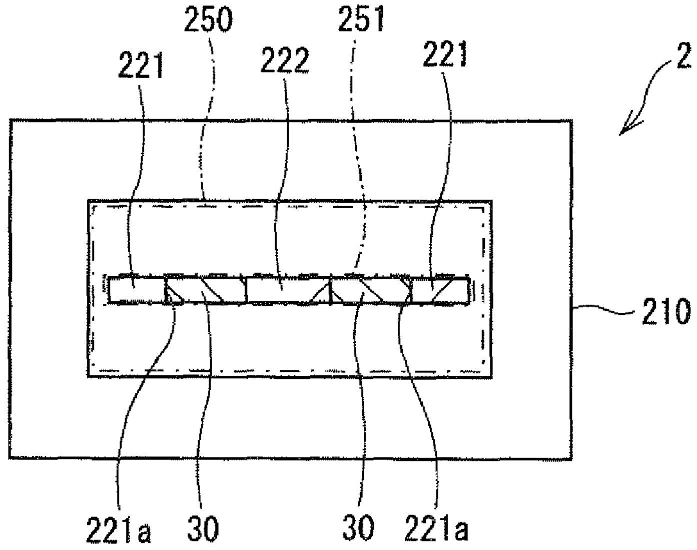
FIG. 3B is a cross sectional view taken along line IIIB-IIIB in FIG. 3A.

With reference to FIGS. 3A and 3B, a magnetizer 2 according to a second embodiment of the present invention includes a magnetizing coil 210 and magnetizing yokes 221, 222. The magnetizing coil 210 is generally the same as the magnetizing coil 10 of the first embodiment except a shape of the magnetizing coil 210. The magnetizing coil 210 is a hollow coil, which is wound into a quadrangular prism shape.

The magnetizing yoke (outer magnetizing yoke segment) 221 is generally the same as the magnetizing yoke 20 of the first embodiment except a shape of the magnetizing yoke 221. The magnetizing yoke 221 is formed into a plate shape (a generally planar shape) that extends in the magnetization direction 52 in the magnetizing area 250, and a through hole 221*a* extends through the magnetizing yoke 221 in a plate thickness direction of the magnetizing yoke 221.

The magnet 30 is fitted into the through hole 221*a* of the magnetizing yoke 221. The magnetizing yoke (inner magnetizing yoke segment) 222, which is made of the same material as that of the magnetizing yoke 221, is fitted to an inner peripheral surface of the annular magnet 30. In this way, end surfaces of the magnet 30, which are located at the ends of the magnet 30 in a direction of the plane of the magnet 30, are covered with the magnetizing yokes 221, 222. More specifically, the outer circumferential surface and the inner circumferential surface (the outer peripheral surface and the inner peripheral surface) of the magnet 30 are covered with and contact with the magnetizing yokes 221, 222, which are placed radially outward and radially inward, respectively of the magnet 30. When the magnetizing yokes 221, 222, which receive the magnet 30, are placed in the magnetizing area 250, a generally planar area 251 in the magnetizing area 250 is substantially filled with the magnetizing yokes 221, 222 and the magnet 30. In this way, the magnetic potential in the planar area 251 becomes generally uniform.

However, opposed side surfaces of the magnet 30, which are opposed to each other in the plate thickness direction of the magnet 30, are exposed from the magnetizing yokes 221, 222. In this way, the magnetic potential in the magnetizing area 250 varies in the plate thickness direction of the magnet 30, so that the magnetizing magnetic field is disturbed. However, even when the magnetic potential in the magnetizing area 250 varies in the direction perpendicular to the magnetization direction 52, the disturbances in the magnetizing magnetic field are relatively small, so that the result of the magnetization of the magnet 30 is not significantly influenced. Particularly, the plate-shaped magnet 30 is relatively thin (e.g., about 5 mm in one instance) in the plate thickness direction of the magnet 30, so that the disturbances in the plate thickness direction will not have a significant influence on the result of the magnetization of the magnet 30.

Thus, when the magnetic potential in the planar area 251 is made generally uniform, the disturbances in the magnetizing magnetic field can be advantageously limited, so that the magnet 30 can be magnetized in the magnetization direction 52 with the relatively high accuracy.

Third Embodiment

Figure 4A:
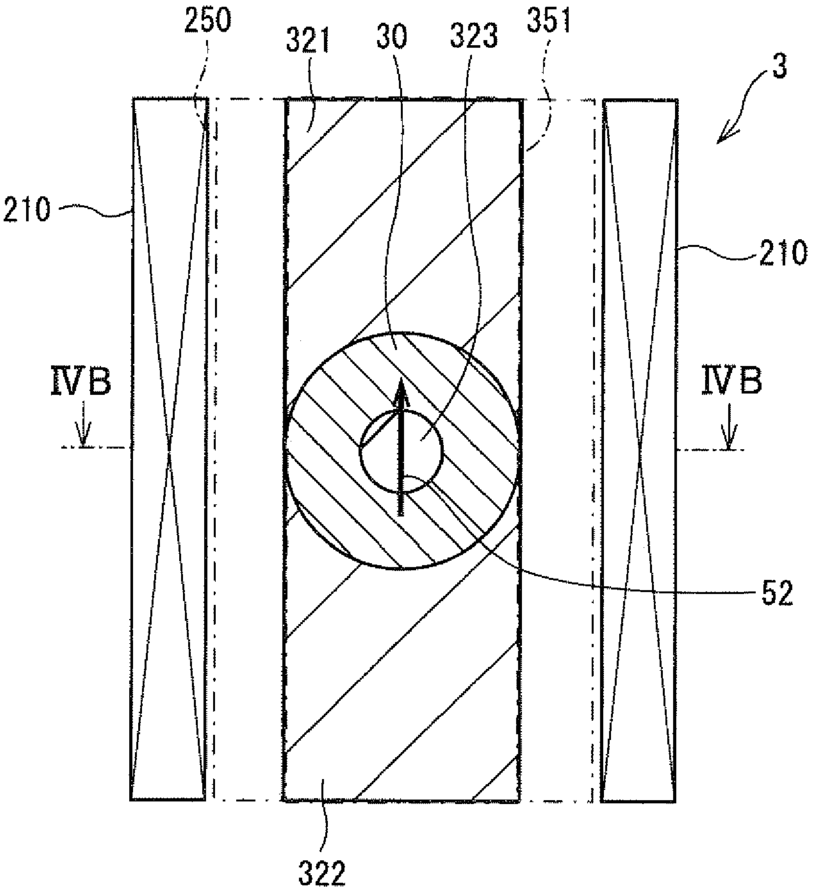
FIG. 4A is a cross sectional view of a magnetizer according to a third embodiment of the present invention.
Figure 4B:
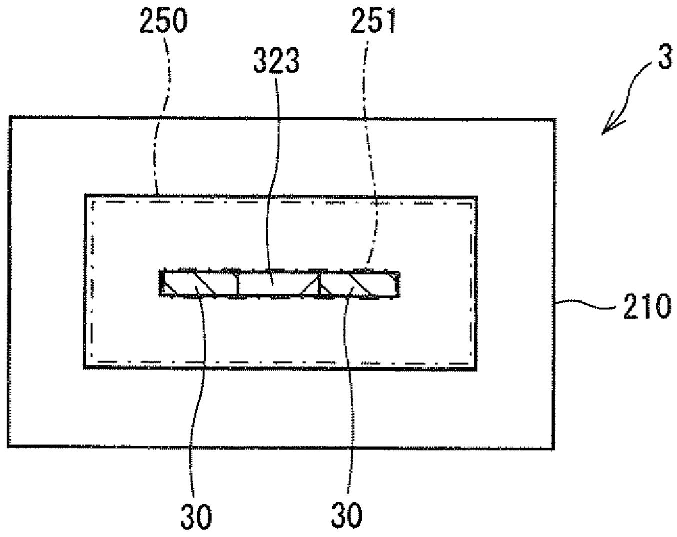
FIG. 4B is a cross sectional view taken along line IVB-IVB in FIG. 4A.
Figure 5:
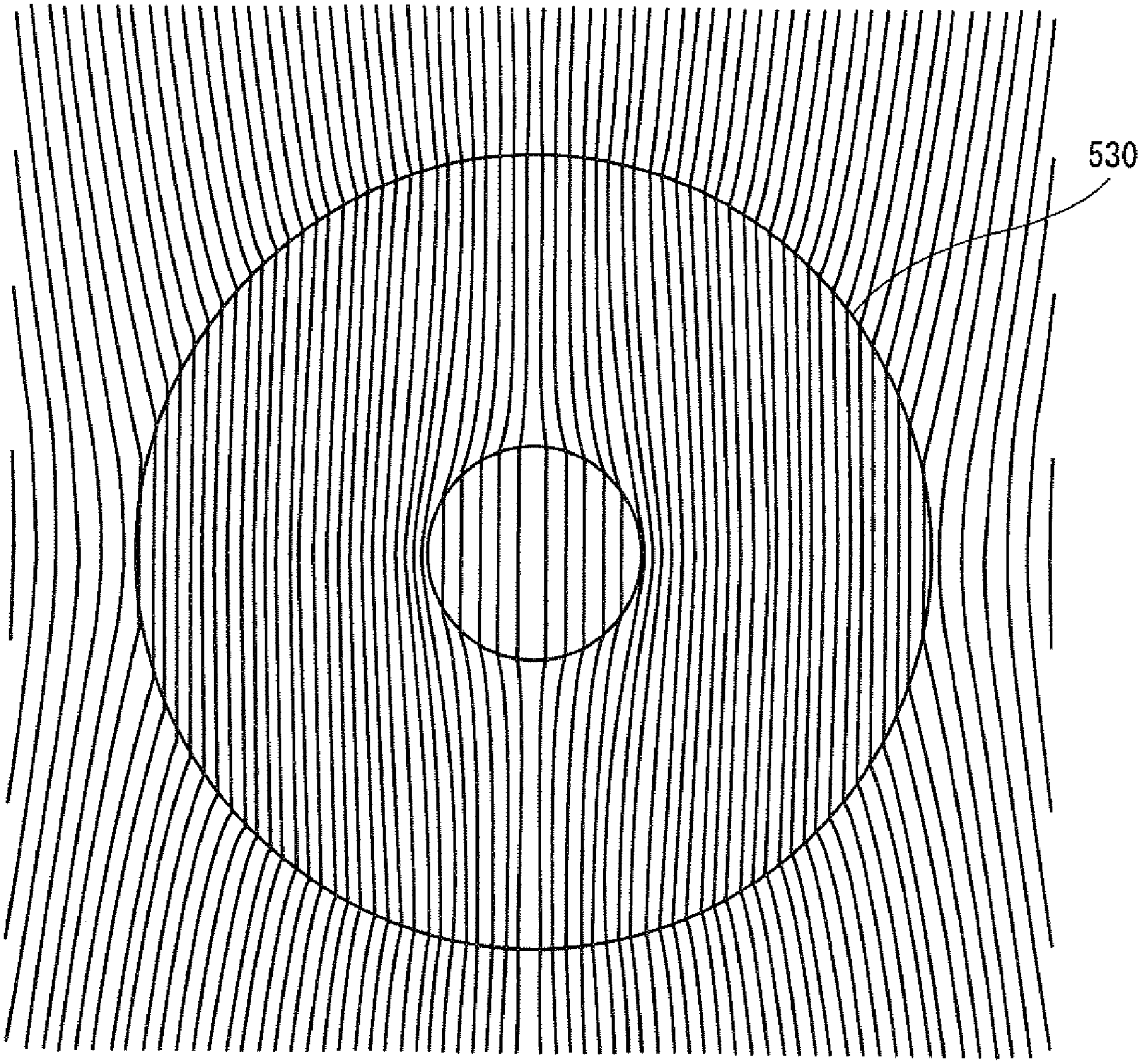
FIG. 5 PRIOR ART
FIG. 5 is a schematic diagram showing a magnetizing magnetic field according to a prior art magnetizing method.

With reference to FIGS. 4A and 4B, a magnetizer 3 according to a third embodiment of the present invention includes a magnetizing coil and magnetizing yokes 321-323. The magnetizing coil of the third embodiment is generally the same as the magnetizing coil 210 of the second embodiment. Hereinafter, the magnetizing coil of the third embodiment will be indicated by the same reference numeral (i.e., numeral 210) as that of the magnetizing coil 210 of the second embodiment.

The magnetizing yokes (outer magnetizing yoke segments) 321, 322 clamp the magnet therebetween in the direction of the plane of the magnet 30, so that the plane of the magnet 30 is held generally in parallel with the magnetization direction 52. The magnetizing yoke (inner magnetizing yoke segment) 323 is fitted to the inner peripheral surface of the magnet 30. In this way, a projected area 351 of the magnet 30 in the magnetizing area 250 on each of first and second sides of the magnet 30 that are opposite from each other in the magnetization direction 52, is substantially filled with the magnetizing yokes 321-323 and the magnet 30. Therefore, the magnetic potential in the projected area 351 becomes generally uniform. Here, the projected area is defined as an area that is created by rectilinear projection of a shape of the magnet 30 in the magnetization direction 52 in the magnetizing area. More specifically, in the case of FIGS. 4A and 4B, one projected area (first projected area) is created on the upper side of the line IVB-IVB in FIG. 4A through rectilinear projection of the rectangular shape at the cross section of the magnet 30 shown in FIG. 4B in the magnetization direction. In other words, when a parallel light beam is irradiated to the magnet 30 from the lower side in FIG. 4A, a shaded area is created above the line IVB-IVB in FIG. 4A to create the projected area (first projected area) in the magnetizing area 250. Thus, the projected area has the same width (the left to right width in FIG. 4A) as that of the magnet 30 and the same thickness (the top to bottom thickness in FIG. 4B) as that of the magnet 30. Similarly, another projected area (second projected area) is created on the lower side of the line IVB-IVB in FIG. 4A through rectilinear projection of the rectangular shape at the cross section of the magnet 30 shown in FIG. 4B along the magnetization direction. In FIG. 4A, these projected areas are indicated by reference numeral 351 as a whole projected area for the illustrative purpose. Here, it should be also noted that although an extent of the projected area 351 in the magnetization direction 52 coincides with that of the magnetizing area 250 in FIG. 4A, the extent of the projected are 351 in the magnetization direction 52 may be shorter than that of the magnetizing area 250 in this and other embodiments.

As discussed above, even when the magnetic potential in the magnetizing area 250 varies in the direction perpendicular to the magnetization direction 52, the disturbances in the magnetizing magnetic field are relatively small, so that the result of the magnetization of the magnet 30 will not be substantially influenced. Therefore, when the magnetic potential in at least the projected area 351 of the magnetizing area 250 is made generally uniform, the disturbances in the magnetizing magnetic field can be limited. Thus, the magnet 30 can be magnetized with the relatively high accuracy in the magnetization direction 52 by the magnetizing magnetic field, which is generally parallel to the magnetization direction 52.

Fourth Embodiment

Components of a magnetizer according to the fourth embodiment are substantially the same as those of the above embodiments except the material of the magnetizing yoke(s). The magnetizing yoke(s) of the fourth embodiment is made of a magnetic material, a magnetic potential of which relative to a strength of an ordinary magnetizing magnetic field, is different from that of the magnet. Here, the strength of the ordinary magnetic field refers to a strength of the magnetic field, which is set according to the material of the magnet and can effectively magnetize this magnet.

Therefore, according to the magnetizing method that uses the magnetizer of the fourth embodiment, a strength of the magnetic field, which is different from the strength of the ordinary magnetizing magnetic field and causes the magnetic potential of the magnetizing yoke and the magnetic potential of the magnet to be generally the same, is set as the strength of the magnetizing magnetic field. For example, in a case where the magnetization characteristic of the magnetizing yoke and the magnetization characteristic of the magnet cross with each other at a cross point, the strength of the magnetic field at this cross point is set as the strength of the magnetizing magnetic field. The electric current, which corresponds to the preset strength of the magnetic field, is supplied to the magnetizing coil, so that the magnetizing magnetic field is generated.

According to the magnetizing method of the magnet of the fourth embodiment, even in the case where the magnetic potential of the magnetizing yoke relative to the strength of the ordinary magnetizing magnetic field cannot be set to generally the same as that of the magnet, when the magnetic potential of the magnetizing yoke in the magnetic field, which has the strength that is different from the strength of the ordinary magnetic field, is generally the same as that of the magnet, the magnet can be magnetized with the relatively high accuracy in the magnetization direction by applying the magnetizing magnetic field, the strength of which causes the magnetic potential of the magnetizing yoke and the magnetic potential of the magnet to be generally the same, to the magnet.

Other Embodiments

In the above embodiments, the parallel magnetic field is generated in the magnetizing area by the coil, which is wound into the cylindrical shape or the quadrangular prism shape. However, the shape of the coil, which serves as the magnetic field generating means, is not limited to the cylindrical shape or the quadrangular shape. Also, the magnetic field generating means may be formed of a plurality of coils.

Additional advantages and modifications will readily occur to those skilled in the art. The invention in its broader terms is therefore not limited to the specific details, representative apparatus, and illustrative examples shown and described.

What is claimed is:

1. A magnetizer for magnetizing a magnet, comprising:

a magnetic field generating means for generating a magnetic field to magnetize the magnet in a magnetizing area, wherein a direction of the magnetic field is generally parallel to a magnetization direction of the magnet in the magnetizing area; and a magnetizing yoke that includes at least one magnetizing yoke segment, wherein the magnetizing yoke holds the magnet and is made of a magnetic material, which exhibits a magnetic potential that is generally equal to a magnetic potential of the magnet in the magnetic field at time of magnetizing the magnet, wherein the magnetizing yoke and the magnet substantially fill a three-dimensional area in the magnetizing area, the three-dimensional area being comprised of the magnet, and three-dimensional projected areas of the magnet in the magnetizing area on each of first and second sides of the magnet that are opposite from each other in the magnetization direction of the magnet in the magnetizing; and a total extent of the three-dimensional area, including the three-dimensional projected area on the first side of the magnet plus the three-dimensional projected area on the second side of the magnet, measured in the magnetization direction, is larger than a total extent of the magnet measured in the magnetization direction, and the magnetizing yoke is disposed adjacent to the magnet on each of the first and second sides of the magnet.

2. The magnetizer according to claim 1, wherein:

the magnetizing yoke holds the magnet, which is configured into a planar shape, in such a manner that a plane of the magnet is generally parallel to the magnetization direction of the magnet in the magnetizing area; and the magnetizing yoke covers an end surface of the magnet, which is located in an end of the magnet in a direction of the plane of the magnet.

3. The magnetizer according to claim 1, wherein the magnetizing yoke entirely covers the magnet.

4. The magnetizer according to claim 1, wherein the magnetizing yoke includes a plurality of plates, which are stacked and joined one after another in a direction perpendicular to the magnetization direction of the magnet and are made of a magnetic material.

5. The magnetizer according to claim 1, wherein:

the magnetizing yoke is made of austenitic stainless steel through cold-working; and the magnetic potential of the magnetizing yoke in the magnetic field at the time of magnetizing the magnet is set to be generally equal to that of the magnet based on a processing rate of the cold-working of the magnetizing yoke.

6. The magnetizer according to claim 1, wherein:

the magnetizing yoke is made of a composite material, which includes a mixture of resin and magnetic powder; and the magnetic potential of the magnetizing yoke in the magnetic field at the time of magnetizing the magnet is set to be generally equal to that of the magnet based on a mixing ratio of the magnetic powder relative to the resin in the mixture.

7. A magnetizer for magnetizing a generally planar ring-shaped magnet, comprising:

a magnetizing coil that generates a magnetic field upon energization thereof to magnetize the ring-shaped magnet in a magnetizing area, wherein a direction of the magnetic field is generally parallel to a magnetization direction of the ring-shaped magnet in the magnetizing area; and a magnetizing yoke that holds the ring-shaped magnet and is made of a magnetic material, which exhibits a magnetic potential that is generally equal to a magnetic potential of the ring-shaped magnet in the magnetic field at time of magnetizing the ring-shaped magnet, wherein the magnetizing yoke contacts both of an outer circumferential surface and an inner circumferential surface of the ring-shaped magnet.

8. The magnetizer according to claim 7, wherein the magnetizing yoke includes:

an outer magnetizing yoke segment, which is placed radially outward of the ring-shaped magnet and contacts the outer circumferential surface of the ring-shaped magnet; and an inner magnetizing yoke segment, which is placed radially inward of the ring-shaped magnet and contacts the inner circumferential surface of the ring-shaped magnet.

9. The magnetizer according to claim 8, wherein the outer magnetizing yoke segment and the inner magnetizing yoke segment are formed integrally.

10. The magnetizer according to claim 8, wherein the outer magnetizing yoke segment and the inner magnetizing yoke segment are formed separately.

11. A magnetizing method for creating magnetic poles in a magnet by placing the magnet in a magnetizing area, in which a direction of a magnetic field is generally parallel to a magnetization direction of the magnet, the method comprising:

receiving the magnet in a magnetizing yoke made of a magnetic material, which exhibits a magnetic potential that is generally equal to a magnetic potential of the magnet in the magnetic field at time of magnetizing the magnet;

placing the magnetizing yoke in the magnetizing area, so that the magnetizing yoke and the magnet substantially fill a three-dimensional area in the magnetizing area, the three-dimensional area being comprised of the magnet, and three-dimensional projected areas of the magnet in the magnetizing area on each of first and second sides of the magnet that are opposite from each other in the magnetization direction of the magnet in the magnetizing area, wherein a total extent of the three-dimensional area, including the three-dimensional projected area on the first side of the magnet plus the three-dimensional projected area on the second side of the magnet, measured in the magnetization direction, is larger than a total extent of the magnet measured in the magnetization direction, and the magnetizing yoke is disposed adjacent to the magnet on each of the first and second sides of the magnet; and applying the magnetic field to the magnet, which is received in the magnetizing yoke.

12. A magnetizing method for creating magnetic poles in a magnet by placing the magnet in a magnetizing area, in which a direction of a magnetic field is generally parallel to a magnetization direction of the magnet, the method comprising:

receiving the magnet in a magnetizing yoke made of a magnetic material;

placing the magnetizing yoke in the magnetizing area, so that the magnetizing yoke and the magnet substantially fill a three-dimensional area in the magnetizing area, the three-dimensional area being comprised of the magnet, and three-dimensional projected areas of the magnet in the magnetizing area on each of first and second sides of the magnet that are opposite from each other in the magnetization direction of the magnet in the magnetizing area, wherein a total extent of the three-dimensional area, including the three-dimensional projected area on the first side of the magnet plus the three-dimensional projected area on the second side of the magnet, measured in the magnetization direction, is larger than a total extent of the magnet measured in the magnetization direction, and the magnetizing yoke is disposed adjacent to the magnet on each of the first and second sides of the magnet; and applying the magnetic field to the magnet, which is received in the magnetizing yoke, wherein a strength of the applied magnetic field makes a magnetic potential of the magnet and a magnetic potential of the magnetizing yoke to be generally the same.

13. The magnetizer according to claim 1, wherein:

the magnetizing yoke substantially covers an entire exposed first side outer end edge surface of the magnet, which is exposed on the first side of the magnet; and the magnetizing yoke also substantially covers an entire exposed second side outer end edge surface of the magnet, which is exposed on the second side of the magnet.

14. The magnetizer according to claim 7, wherein the magnetizing yoke substantially covers both of an entire area of the outer circumferential surface and an entire area of the inner circumferential surface of the ring-shaped magnet.

15. The magnetizing method according to claim 11, wherein the receiving of the magnet in the magnetizing yoke includes receiving the magnet in the magnetizing yoke such that the magnetizing yoke substantially covers an entire exposed first side outer end edge surface of the magnet, which is exposed on the first side of the magnet, and the magnetizing yoke also substantially covers an entire exposed second side outer end edge surface of the magnet, which is exposed on the second side of the magnet.

16. The magnetizing method according to claim 12, wherein the receiving of the magnet in the magnetizing yoke includes receiving the magnet in the magnetizing yoke such that the magnetizing yoke substantially covers an entire exposed first side outer end edge surface of the magnet, which is exposed on the first side of the magnet, and the magnetizing yoke also substantially covers an entire exposed second side outer end edge surface of the magnet, which is exposed on the second side of the magnet.

* * * * *